United States Patent [19]

Iwashita et al.

[11] Patent Number: 5,423,072
[45] Date of Patent: Jun. 6, 1995

[54] TESTING TRANSMITTER-RECEIVER APPARATUS FOR SECTOR CELL BASE STATION

[75] Inventors: Masakazu Iwashita; Osamu Kojima, both of Tokyo, Japan

[73] Assignee: NEC Corporation, Tokyo, Japan

[21] Appl. No.: 89,374

[22] Filed: Jul. 12, 1993

[30] Foreign Application Priority Data

Jul. 15, 1992 [JP] Japan .................................. 4-187729

[51] Int. Cl.6 ........................ H01Q 1/42; H04B 17/00
[52] U.S. Cl. .................................... 455/67.4; 455/25; 455/53.1; 455/115; 455/129; 343/703; 343/872
[58] Field of Search ...................... 455/25, 33.1, 33.2, 455/33.3, 53.1, 56.1, 67.1, 67.4, 67.7, 115, 129, 101, 272, 277.1, 280; 343/702, 703, 795, 872

[56] References Cited

U.S. PATENT DOCUMENTS 4,726,050 2/1988 Menich et al. ................. 455/33.3 X
5,278,571 1/1994 Helfrick ............................. 343/703

Primary Examiner—Reinhard J. Eisenzopf
Assistant Examiner—Chi H. Pham
Attorney, Agent, or Firm—Young & Thompson

[57] ABSTRACT

In sector cell base stations, directive antennae with box-shaped reflectors are widely used. By way of a testing antenna incorporated such a reflector box, stable and appropriate electromagnetic coupling to the antenna elements of the directive antenna can be realized and undesirable coupling from outside the reflector box can be prevented, thereby improving the reliability of the testing system.

2 Claims, 3 Drawing Sheets

TESTING TRANSMITTER-RECEIVER APPARATUS FOR SECTOR CELL BASE STATION

BACKGROUND OF THE INVENTION

1. Field of the Invention

This invention relates to a testing transmitter-receiver apparatus for a transmitter-receiver for a sector cell base station in mobile communications, and more particularly to a testing transmitter-receiver apparatus to supervise a transmitter-receiver of a sector cell base station which uses a directive antenna with a box shaped reflector for a generally sectorial service area.

2. Description of the Related Art

Conventionally, while a testing transmitter-receiver equipment having the same performance as a mobile transmitter-receiver equipment used to supervise the operation of a transmitter-receiver of a base station, it is an installation requirement that a testing antenna connected to the testing transmitter-receiver have a suitable degree of coupling to the main antenna connected to the communication transmitter-receiver and have a sufficient degree of coupling attenuation from the main antennae of adjacent base stations. This installation requirement is not easy to satisfy if buildings or like structures are present in the immediate area. Particularly, when a sector cell base station is installed for use with a plurality of sector cells, since the main antennae for adjacent sector cells are located close to each other, it is very difficult to prevent electromagnetic coupling among the main antennae and to also suppress coupling between the testing antennae and the main antennae used for the different sector cells.

SUMMARY OF THE INVENTION

It is an object of the present invention to provide a reliable testing transmitter-receiver apparatus for a sector cell base station wherein a testing antenna is incorporated in a reflector box of the directive antenna for a sector cell in such a manner that it has a stable and appropriate degree of electromagnetic coupling to the antenna elements of the directive antenna and is not influenced by an electromagnetic field outside the reflector box.

It is another object of the present invention to provide a testing transmitter-receiver apparatus wherein a test can be performed by a single testing transmitter-receiver even at a sector cell base station having a plurality of sector cells.

In order to attain the objects described above there is provided a testing transmitter-receiver apparatus for a sector cell base station having a directive antenna connected to a transmitter-receiver for said base station, the antenna elements of said directional antenna being incorporated in a reflector box of said directive antenna, characterized in that a testing antenna connected to a testing transmitter-receiver constituting said testing transmitter-receiver apparatus that receives radio waves radiated from said antenna elements as a testing signal and radiates testing radio waves toward said antenna elements is incorporated in said reflector box in such a manner that it is electromagnetically coupled to said antenna elements with an appropriate degree of coupling and is electromagnetically isolated from the outside of said reflector box.

DESCRIPTION OF THE PREFERRED EMBODIMENT

Embodiments of the present invention are described in detail below with reference to the accompanying drawings.

Figure 1:
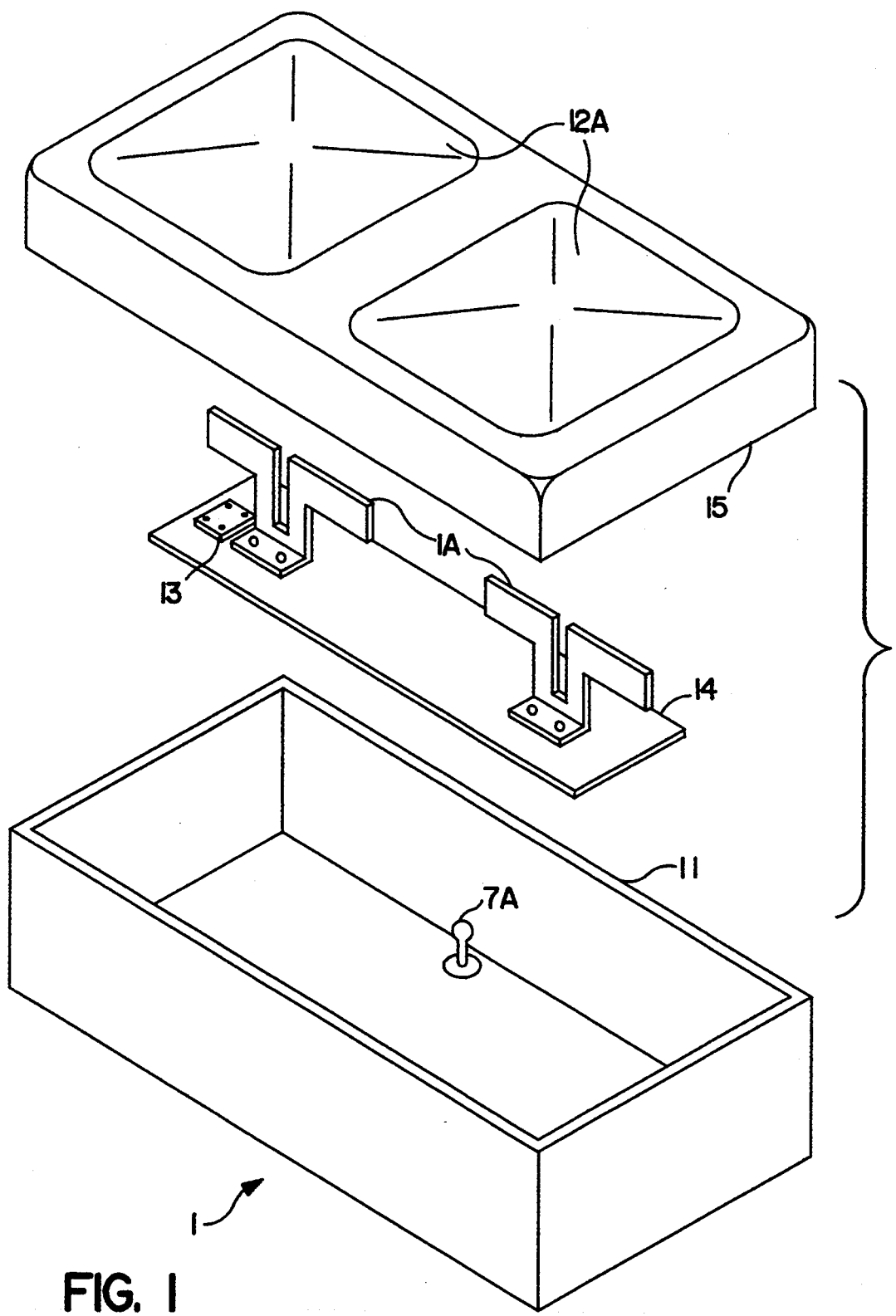
FIG. 1 is a perspective view showing an example of an assembly of a directive antenna with a reflector box.

FIG. 1 is a perspective view showing an example of an assembly of a directive antenna 1 with a reflector box 11 including a testing antenna 7A in the form of a coupling loop accommodated inside a reflector box 11.

The directive antenna 1 with a box-shaped reflector includes a pair of antenna elements 1A, a feeder connecting member 13 for connecting a feeder to the antenna elements 1A, a mounting plate 14 on which the antenna elements 1A and the connecting member 13 are mounted, a reflector box 11 for accommodating and securing the mounting plate 14 to the bottom thereof, a testing antenna 7A having a shape such that the coupling loop thereof extends into the reflector box 11 through a hole in the bottom of the reflector box 11, and a lid 15 for covering and closing the top of the reflector box 11 with the mounting plate 14 accommodated therein. The lid 15 is provided with a pair of window-like dielectric covers 12A opposed to the antenna elements 1A for passing radio waves therethrough. Here, such factors as the size and direction of the coupling loop of the testing antenna 7A are set such that the antenna elements 1A and the testing antenna 7A may have an appropriate electromagnetic coupling relationship to each other. Further, since interference waves, reflection waves and other like waves outside the reflector box 11 are intercepted by the reflector box 11 and lid 15, the coupling of undesired waves to the testing antenna 7A is reduced to a very low degree.

Figure 2:
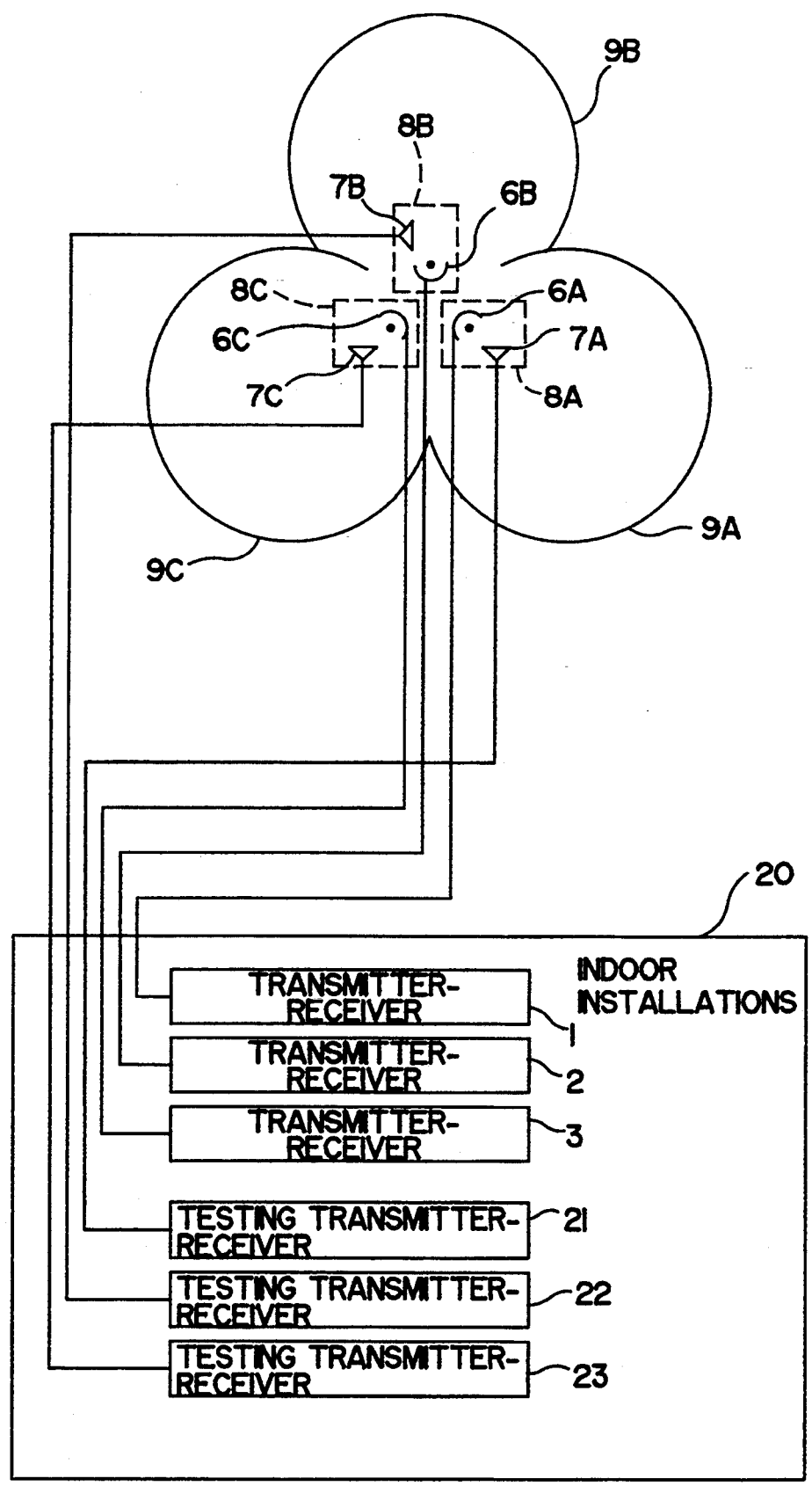
FIG. 2 shows an example of the construction of a sector cell base station having three sector cells.

FIG. 2 shows an example of the construction of a sector cell base station having three sector cells 9A, 9B and 9C.

Base station transmitter-receivers 1, 2 and 3 for transmitting and receiving radio waves to and from the three sector cells 9A, 9B and 9C, respectively, and testing transmitter-receivers 21, 22 and 23 corresponding to the transmitter-receivers 1, 2, 3, respectively, are provided in an indoor installation 20. Meanwhile, the main antennae 6A, 6B and 6C connected to the transmitter-receivers 1, 2 and 3, respectively, are installed in an outdoor location. The testing transmitter-receivers 21, 22 and 23 are connected to the testing antennae 7A, 7B, 7C, respectively. Communications with sector cells 9A, 9B and 9C are performed by radio waves radiated from the transmitter-receivers 1, 2 and 3 by way of the main antennae 6A, 6B and 6C, respectively. Here, a system test for each of the sector cells is performed, for example, for sector cell 9A, by transmitter-receiver 1 and testing transmitter-receiver 7A which transmit and receive a radio signal to and from each other by way of the main antenna 6A and testing antenna 7A, respectively. Accordingly, it is necessary to adjust such factors as the position, the direction, and the distance from the main antenna 6A of the testing antenna 7A so that the testing antenna 7A may be so located as to have an appropriate degree of coupling to the main antenna 6A but have minimized coupling relationships to the other main antennae 6B and 6C. The coupling adjustment just described is very easy if the main antenna 6A and testing antenna 7A are assembled in the manner illustrated in FIG. 1. In FIG. 2, the testing antennae 7A, 7B and 7C are installed inside reflector boxes 8A, 8B and 8C of the main antennae 6A, 6B and 6C, respectively.

Figure 3:
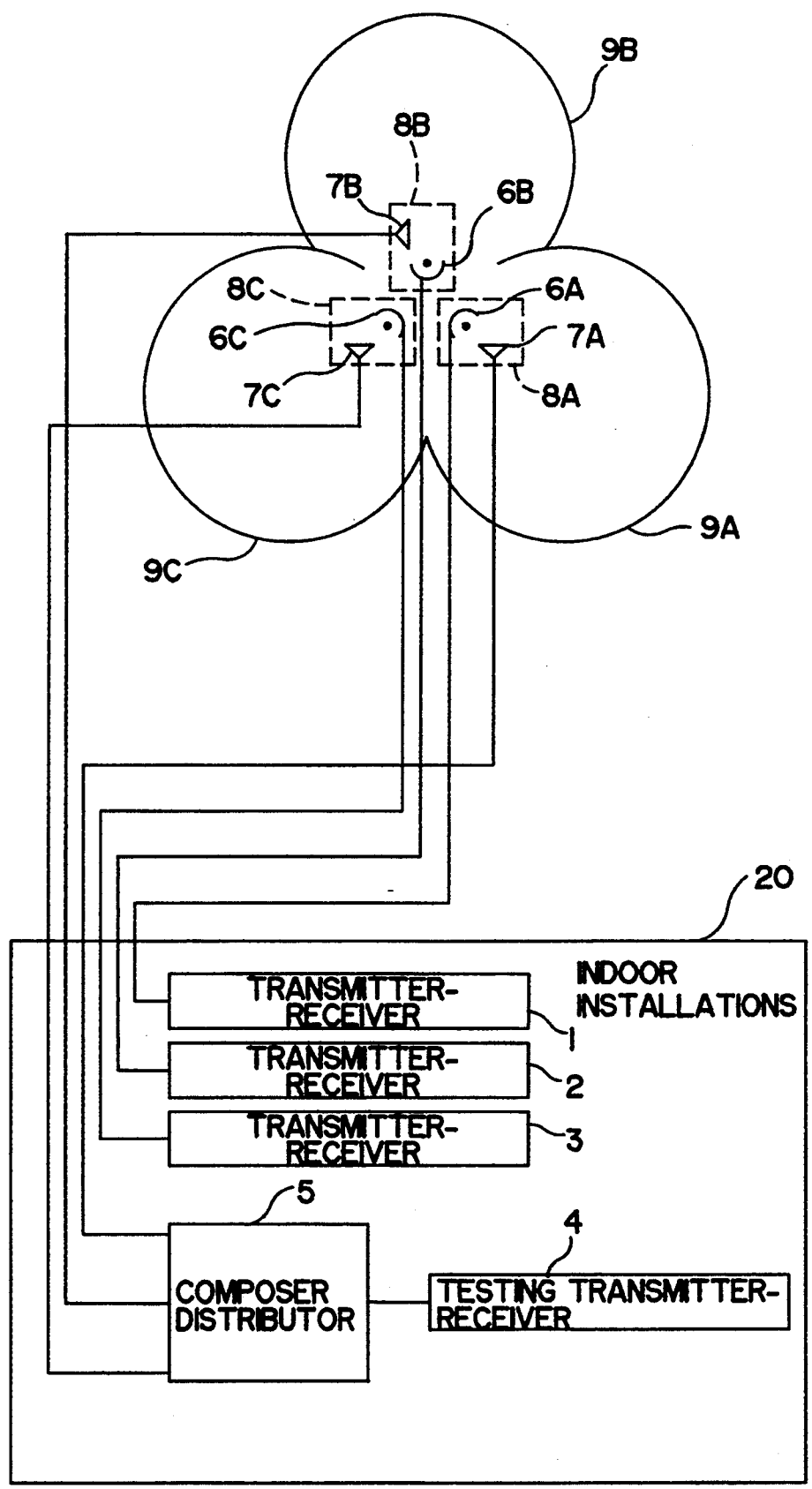
FIG. 3 shows a similar sector cell base station having a single testing transmitter-receiver.

In another embodiment shown in FIG. 3, an arrangement or an assembly structure of the main antennae and testing antennae is similar to that in FIG. 2 with the exception that the number of testing transmitter-receivers is reduced to one, and this single transmitter-receiver 4 is connected to the three testing antennae 6A, 6B and 6C of three sector cells by way of a single composer-distributor 5. Modifications of the invention herein disclosed will occur to a person skilled in the art and all such modifications are deemed to be within the scope of this invention as defined by the appended claims.

What is claimed is:

1. A testing transmitter-receiver apparatus for a sector cell base station comprising:
    a directive antenna comprising antenna elements;
    a base station transmitter-receiver connected to said directive antenna;
    a reflector box having an open top portion, said directive antenna being mounted on a bottom surface of said reflector box;
    a testing antenna also mounted on a bottom surface of said reflector box;
    a testing transmitter-receiver connected to said testing antenna, said testing transmitter-receiver receiving, through said testing antenna, testing signals as radio waves radiated from said antenna elements, and transmitting, through said testing antenna, testing signals as radio waves toward said antenna elements;
    a lid to close and cover said open top portion, said lid having a pair of dielectric covers at locations opposed to said antenna elements;
    said testing antenna being of a size and orientation relative to said antenna elements to exhibit a desired degree of electromagnetic coupling with said antenna elements.

2. A testing transmitter-receiver apparatus for a sector cell base station comprising:
    a directive antenna comprising antenna elements;
    a base station transmitter-receiver connected to said directive antenna;
    a reflector box having an open top portion, said directive antenna being mounted on a bottom surface of said reflector box;
    a testing antenna mounted in said reflector box in such a manner that a coupling loop of said testing antenna extends into said reflector box through a hole in said bottom surface;
    a testing transmitter-receiver connected to said testing antenna, said testing transmitter-receiver receiving, through said testing antenna, testing signals as radio waves radiated from said antenna elements, and transmitting, through said testing antenna, testing signals as radio waves toward said antenna elements;
    a lid to close and cover said open top portion, said lid having a pair of dielectric covers at locations opposed to said antenna elements;
    said coupling loop being of a size and orientation relative to said antenna elements that said coupling loop exhibits a desired degree of electromagnetic coupling with said antenna elements.

* * * * *